United States Patent [19]

Klein

[11] 4,012,267
[45] Mar. 15, 1977

[54] PROCESS FOR PRODUCING PULTRUDED CLAD COMPOSITES

[75] Inventor: Theodore Harold Klein, Livingston, N.J.

[73] Assignee: Bell Telephone Laboratories, Incorporated, Murray Hill, N.J.

[22] Filed: July 10, 1975

[21] Appl. No.: 594,580

[52] U.S. Cl. .................. 156/178; 156/244; 156/272; 156/324
[51] Int. Cl.² ................... B29G 7/00; B32B 15/14
[58] Field of Search .......... 156/244, 272, 380, 436, 156/178, 500, 242, 324; 264/174, 176 R, 177 R, 177 F

[56] References Cited

UNITED STATES PATENTS

| | | | |
|---|---|---|---|
| 1,726,343 | 8/1929 | Danziger et al. | 317/260 |
| 2,871,911 | 2/1959 | Goldsworthy et al. | 156/441 |
| 3,068,130 | 12/1962 | Gaquin et al. | 428/318 |
| 3,236,714 | 2/1966 | Traut | 156/307 |
| 3,391,040 | 7/1968 | Keyt | 156/171 |
| 3,448,489 | 6/1969 | Boggs | 425/71 |
| 3,556,888 | 1/1971 | Goldsworthy | 156/380 X |
| 3,562,085 | 2/1971 | Crandal et al. | 428/251 |
| 3,644,161 | 2/1972 | Hall | 156/272 |
| 3,684,610 | 8/1972 | Frielingsdorf et al. | 156/244 |
| 3,733,246 | 5/1973 | Thomson et al. | 156/244 X |
| 3,780,152 | 12/1973 | Friesner | 156/244 |
| 3,783,066 | 1/1974 | Myers | 156/178 X |
| 3,801,407 | 4/1974 | Goldsworthy et al. | 156/272 X |
| 3,810,816 | 5/1974 | Zachariades | 428/428 |
| 3,837,992 | 9/1974 | Sherman et al. | 428/247 |

FOREIGN PATENTS OR APPLICATIONS 1,030,446   5/1966   United Kingdom

Primary Examiner—Charles E. Van Horn
Assistant Examiner—M. G. Wityshyn
Attorney, Agent, or Firm—Peter V. D. Wilde

[57] ABSTRACT

A method of continuously producing clad composites is disclosed. The cladding is combined with a resin-wet reinforcement and pultruded through a forming and curing die in a single processing step.

12 Claims, 1 Drawing Figure

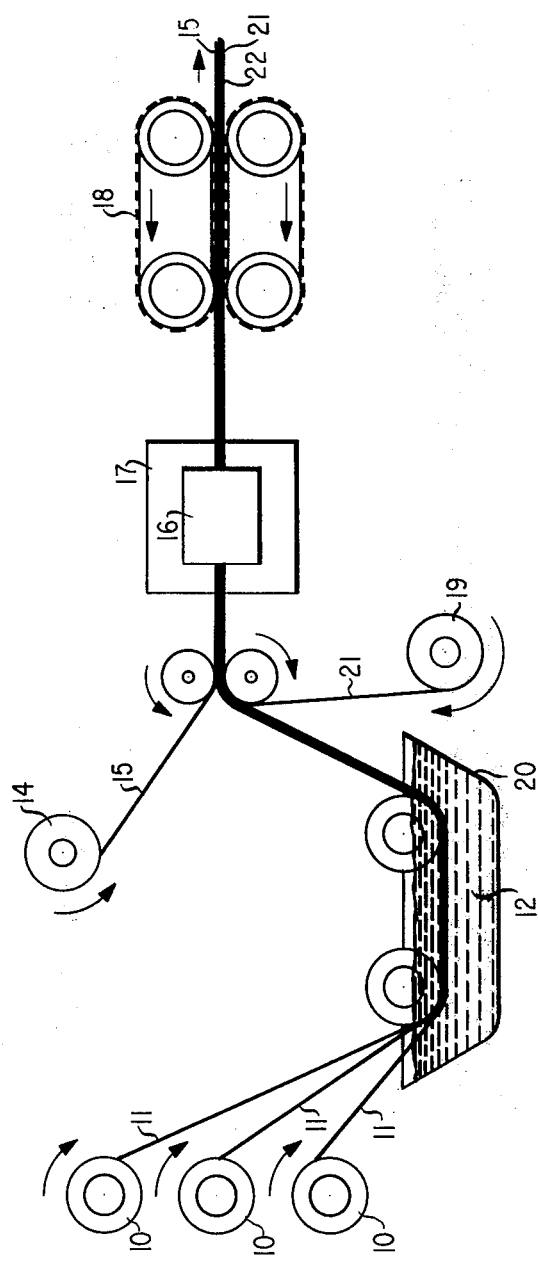

PROCESS FOR PRODUCING PULTRUDED CLAD COMPOSITES

BACKGROUND OF THE INVENTION

1. Field of the Invention

This invention relates to the manufacture of clad composites--for example, copper clad composite for use as printed circuit wiring board. A batch-type process is commonly used in the manufacture of such composites. In this application a method is disclosed by which these clad composites can be manufactured in a continuous, single step process. It is estimated that this new technique can reduce manufacturing costs by as much as fifty percent.

2. Description of the Prior Art

The manufacture of resin-impregnated composite bodies has gone through a period of considerable technical evolution during the past half century. At the start of this period such composites were formed by means of wet lay-up techniques. In these procedures an assembly of fibrous material is impregnated with an appropriate resin which is subsequently cured. Two different wet lay-up techniques were prevalent. In the hand lay-up technique successive layers of fiber and liquid resin are built up. In the spray lay-up technique a mixture of fiber and resin is sprayed on an appropriate base to a predetermined thickness. Depending on the use envisioned for the final product, cladding might be situated on the resin-wet fiber. The resin is then cured in order to fully cross-link the polymeric structure. The result is a hard clad composite such as a metal clad composite, which might be used as printed circuit wiring board. The principal drawbacks in these techniques is that they require large amounts of hand labor, the quality of the final product is largely operator dependent and they are batch-type processes which do not lend themselves to continuous manufacturing, with the cost reduction that naturally flows from such continuous techniques.

A considerable improvement in composite manufacturing occurred when it was found that resin impregnation and partial curing could be effected in a single continuous procedure. In this procedure continuous fibrous reinforcement material, either woven or unwoven, is unwound from a large spool, immersed in a resin bath and drawn passed metering devices to control resin deposition. The resin-impregnated fiber reinforcement is then guided through an oven where the resin is only partially cured and dried. This partially cured composite is then formed into large rolls, perhaps with interleaved polyethylene to prevent sticking, for later use. The fibrous reinforcement which is resin impregnated and partially cured is referred to as "prepreg." In the production of clad composite the previously supplied prepreg is cut into large sheets, overleaved with cladding and heated under pressure. During this heating the resin is fully cured and the cladding is thusly attached to the composite. One sheet of prepreg may be used, or a number may be stacked to form a laminate. The continuous manufacture of the prepreg was made possible only through the careful control of resin content, the development of resins, catalysts, and other additives capable of intermediate curing with only partial crosslinking, and the highly controlled deposition of resin on the reinforcement material.

While the prepreg technique is the current state of the art process for the production of clad reinforced composite, the technique is still not amenable to continuous production. The final pressing and curing of the composite and the cladding is a batch step, and as such much of the advantage gained in the continuous production of the prepreg is not fully realized. The instant invention however, provides for the continuous single-step production of clad composites.

A collateral development which adds to the meaningful light in which the instant invention might be viewed is the introduction of molded plastics, specifically pultruded composites. There exist many techniques for molding plastics including, for example, liquid die injection and the use of split molds. However, as is the case for most of the molding techniques, these are batch-type processes and, consequently, do not exhibit the economic advantages inherent in continuous production methods. A more recent development allows for continuous production of molded plastics. In this process--referred to as pultrusion--a fibrous material is impregnated with resin and then pulled through a die. Significant heating and compression take place as the material is "pultruded" through the die, and the result is a fully cured and totally cross-linked reinforced plastic. Depending on the shape of the die, the completed product assumes any spatial characteristics desired and practical. In this process there is no intermediate product which is partially cured, as in the prepreg process. This is rather a single-step technique in which the resin is taken from the noncured "A stage" to the fully cured "C stage", and is molded, in one single continuous process. Although there is significant compression, and consequently great pressure, as the large amount of resin-impregnated fiber is forced into the die and pulled through it, the viscosity of the resin provides some natural lubrication and additional chemical components may be added to alleviate any adhesion to the die walls. In order to minimize such adhesion at the exit end of the die, where the resin is essentially fully cured and dry, only those resins which contract on curing are used.

SUMMARY OF THE INVENTION

The instant invention is a single-step continuous process for producing clad reinforced composites. In the practice of this invention a continuous assemblage of wet, resin-impregnated reinforcement is combined with a continuous sheet of cladding and is pultruded through a die. This combination is fully cured in the die yielding a cured clad composite. In this process the resin-wet fibrous material is combined with a cladding, molded, and taken from "A stage" to "C stage" curing in one single step continuous process. The curing process does not require any previously processed prepreg and does not include any batch processing. A specific embodiment of this process involves the fabrication of metal clad composite for use as printed circuit wiring board.

BRIEF DESCRIPTION OF THE DRAWING

The FIGURE is a schematic representation of a pultrusion apparatus as applied to the formation of clad composites.

DETAILED DESCRIPTION

In the practice of this invention, a resin-impregnated reinforcement is combined with a cladding material and the combination is formed and cured in a single continuous process by pultruding the said combination through a curing and firming die. As shown in the FIG- URE, the reinforcement 11 is usually supplied on rolls 10. The reinforcement may be supplied on one roll or on a multitude of rolls. The reinforcement is continuous, but may be woven or simply unidirectional strands, depending on the strength requirements of the finished product. In any event, the continuous reinforcement should, at the very least, be sufficiently strong to survive being pulled through the apparatus shown in the FIGURE.

Before the apparatus in the FIGURE is engaged, the various materials 11, 15, and 21 may be threaded through the apparatus while dry. The resin bath 20 is then filled with an appropriate resin 12, and the reinforcement, in the course of being guided through this bath, is impregnated with the said resin. The resin-wet reinforcement 13 is then combined with a continuous sheet of cladding 15--usually provided from a roll 14---and lead through a die 16 where the material is simultaneously formed and cured. In the practice of this invention, the composite may be cladded either on one side or on both sides. In the event that the composite is to be cladded on both sides, a second roll 19 of material 21 is also provided. The upper and lower cladding materials 15 and 21 need not be identical and, depending on the product, may be metallic foils, plastics, or other materials either natural or synthetic.

In the normal pultrusion process in which molded composites are formed, the resins may be either epoxies, phenolics, polybutadienes, polyesters, or similar resinous compounds. However the resins must be liquid and of sufficient viscosity to effectively wet the reinforcement material. Viscosities in the range of 1000 to 3000 centipose have been found to be most effective. Because of the large pressures encountered in the die and the proclivity of the resin for adhering to the die, mold releases may be added to the resin compound. These mold releases inhibit any tendency that the resin might have to adhere to the die as the curing proceeds. In addition, only contracting resins which shrink upon curing are used. Although this shrinkage is only slight, it is sufficient to aid in passing the material through the die, especially in the latter sections of the die where the resin is cured and no longer fluid.

A number of new considerations enter into the evaluation of resins which may be used in the manufacture of clad composites using the instant pultrusion technique. Many of these considerations center about the way in which the resins cure, and the effect that the curing has on the bonding between the cladding and the composite material. For example, the commonly used phenolic resins cure by means of a condensation reaction during which condensates in the form of vapor are omitted from the resin. In normal match die molding or press laminating procedures there are adequate openings through which these condensates may be vented. However the pultrusion devices, as they are commonly used, provide no opportunity for venting condensates. Consequently, only those resins which cure without the formation of byproducts are satisfactory where high peel strengths are required and the byproducts cannot be adequately vented.

In like manner, the mold releases which may be added to the resin in the normal practice of pultrusion tend to restrict the adhesion of not only the composite to the die, but also of the cladding to the composite. As a result, such mold releases also lower the peel strength of the cladding and may be omitted where high peel strength is required. However, it has been found that many claddings have less of a tendency to adhere to the die walls than the unclad composite. Consequently, the absence of mold releases may be tolerated in such a practice of this invention. Alternatively, the die may be coated with teflon or any other material which has low-stick properties. If the composite is to be clad on only one side, the other side may be sprayed with a mold release before insertion into the die, instead of including the mold release in the resin.

Recent work has led to the development of new mold releases which may not degrade the adhesion tendencies of the cladding. These mold releases only operate during the initial curing stages and diminish in effectiveness during the latter curing stages. Consequently, when these mold releases are used there is little interference with the adhesion of the cladding during the final curing period.

It has been found that the surface smoothness of the composite and the presence of microcracks degrade the electrical insulating properties of the composite. Whereas such surface smoothness is generally unimportant in the pultrusion manufacture of molded plastics, it takes on significant importance if a cladding is to be added, according to the practice of this invention, for use in printed wiring board. Consequently, low profile additives--generally thermoplastic compounds---may be included in the resin to improve its smoothness characteristics when such applications are envisioned.

In situations where the cladding is a metal foil which is vulnerable to oxidation or other contamination, special pre-bonding treatments may be applied to the foil surface to remove such contaminants, prevent harmful film formation and promote bonding to the composite. So, for example, the side of the foil which is to be bonded to the composite may be subjected to a protective metallic flash.

The resins which will generally be used in the practice of this invention are thermosetting resins which cure upon heating. In such a situation, 17 will be a heating device which stimulates such curing. The heating may be supplied by common resistive elements or by any other technique, such as rf heating. The invention, however, is not limited to thermosetting resins and may be practiced with the use of any resin; for example, those which cure upon exposure to ultraviolet radiation. In such a case, 17 will be source of ultraviolet light. The curing temperature, or other curing variable depending upon the resin being used, and the rate of pultrusion through the die, are controlled and optimized depending on the particular resin being used. The pultrusion rate is controlled by means of the extracting mechanism 18. In any event, it has been found that the tension on the total clad composite 22, as well as on the individual components 13, 15, and 21, is critical if tearing of the cladding is to be avoided. No mathematical means for determining the proper tension has been discovered. However, the normal experimental techniques for determining these parameters are well known in the art.

EXAMPLE I

A copper clad composite was fabricated according to the teachings of this specification using a resin whose formulation is shown in Table I. The finished product was found to have the properties described in Table II. In this table the properties of the pultruded composite are compared with those of a similar laminated composite fabricated according to the prior art techniques,

Table I

| | Parts By Weight |
|---|---|
| 1. NAR Resin No. 3008 (North American Rockwell resin) | 45 parts |
| 2. NAR Resin No. 2256 (Brominated to improve flame retardance) | 22.5 parts |
| 3. Styrene (monomer) | 3.1 parts |
| 4. ANS 55 Catalyst (Benzoyl Peroxide Paste) | 1.0 parts |
| 5. Antimony Trioxide (fire retardant) | 3.5 parts |
| 6. ASP 400 Clay (filler) | 23.6 parts |
| 7. DF 103 (Dow Chemical Antifoamer) | 0.5 parts |
| 8. Zelac "UN" (Internal Mold Release) | 0.5 parts |

Table II

| | Pultruded Polyester-Glass Copper-Clad Composite | Laminated Polyester-Glass Copper-Clad Composite |
|---|---|---|
| Solder Dip Resistance 500°F Molten solder Float | > 20 sec. | > 20 sec. |
| Water Absorption Percent 24 Hours in Water | .34 | .30 |
| Combustability Percent Oxygen Index | 31 | 34 |
| Peel Strength | 2.5 | 7.7 |
| Barcol Hardness | 59 | 40 |
| Flexural Strength Machine Direction (lbs.) | 49,100 | 21,500 |
| Flexural Strength Across Machine Direction (lbs.) | 19,700 | 18,500 |
| Cost per Square Foot | $.53 | $1.30 |

The reinforcement used in this example was an isotropic mat with unidirectional rovings, both composed of glass fibers. The fiberglass was separated when taken through the resin bath in order to facilitate saturation. The resin was of the polyester type and included additives such a flame retardants, catalysts and fillers. In this example an internal mold release was included in the resin accounting for the relatively low peel strength of the cladding. The resin was thermoseting and was heated to between 250° F and 300° F in the die. The die was 5 feet along and 15 inches wide and had an opening of 0.060 inches. In keeping with the tendency of the resin to contract on curing the composite was 0.058 inches on completion of the process. The copper foil was .0014 inches and the composite was pultruded at the rate of 1 foot per minute. The tension on the composite was adjusted and synchronized to eliminate folds in the foil. The copper foil was introduced onto the composite and into the die after the machine was started, though it may have been introduced dry before the run, as was the reinforcement. The completed product was rolled into a 20 inch roll, for convenience in shipping.

The above example is illustrative only, and the parameters utilized in the example may be varied consistent with the practice of this invention.

What is claimed is:

1. A continuous process for forming a composite of a fibrous first material clad with at least one second metal foil cladding material comprising:
   a. impregnating a continuous length of a fibrous first material with a contracting liquid resin,
   b. combining the impregnated fibrous first material in a continuous manner with a continuous length of a second metal foil cladding material,
   c. pultruding in a continuous manner the combination of the first and second materials through a forming and curing die,
   thereby continuously and simultaneously forming and fully curing a clad composite.
2. The process of claim 1 where the resin is a polyester resin.
3. The process of claim 1 where the cladding is on only one side of the composite.
4. The process of claim 3 where the unclad side of the composite is sprayed with a mold release prior to entering the die.
5. The process of claim 1 where the metal foil is copper.
6. The process of claim 1 where the cladding is on both sides of the composite.
7. The process of claim 6 where the upper and lower claddings are the same material.
8. The process of claim 6 where the upper and lower cladding are of copper metal foil.
9. The process of claim 6 where the upper and lower claddings are of different materials.
10. The process of claim 9 where one of the said different cladding materials is a copper metal foil.
11. The process of claim 1 where the resin is one which is cured by heating.
12. The process of claim 1 where the resin is one which is cured by exposure to ultraviolet radiation.

* * * * *